United States Patent
Jang et al.

(10) Patent No.: US 10,338,114 B2
(45) Date of Patent: Jul. 2, 2019

(54) APPARATUS AND METHOD OF DETERMINING FREQUENCY OF AC POWER SOURCE

(71) Applicant: Hyundai Motor Company, Seoul (KR)

(72) Inventors: Hui Sung Jang, Gyeonggi-do (KR); Gi Bong Son, Gyeonggi-do (KR); Hyun Wook Seong, Gyeonggi-do (KR); Dong Jun Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 104 days.

(21) Appl. No.: 15/350,847

(22) Filed: Nov. 14, 2016

(65) Prior Publication Data

US 2017/0336448 A1 Nov. 23, 2017

(30) Foreign Application Priority Data

May 23, 2016 (KR) .................. 10-2016-0062602

(51) Int. Cl.
| | |
|---|---|
| *G01R 23/02* | (2006.01) |
| *B60L 11/18* | (2006.01) |
| *H02M 7/02* | (2006.01) |
| *H03K 5/24* | (2006.01) |
| *G01R 31/42* | (2006.01) |

(52) U.S. Cl.
CPC .......... *G01R 23/02* (2013.01); *B60L 11/1811* (2013.01); *B60L 11/1816* (2013.01); *B60L 11/1848* (2013.01); *G01R 31/42* (2013.01); *H02M 7/02* (2013.01); *H03K 5/24* (2013.01); *Y02T 10/7005* (2013.01); *Y02T 10/7072* (2013.01); *Y02T 90/121* (2013.01); *Y02T 90/127* (2013.01); *Y02T 90/128* (2013.01);

(Continued)

(58) Field of Classification Search
None
See application file for complete search history.

(56) References Cited

U.S. PATENT DOCUMENTS

| | | | | |
|---|---|---|---|---|
| 9,178,415 | B1 * | 11/2015 | Kost | H02M 3/157 |
| 2015/0180356 | A1 * | 6/2015 | Norisada | H02M 3/33546 |
| | | | | 363/17 |
| 2016/0126825 | A1 * | 5/2016 | Huang | H02M 1/143 |
| | | | | 363/46 |

FOREIGN PATENT DOCUMENTS

| | | |
|---|---|---|
| JP | 2005-204204 A | 7/2005 |
| JP | 2009-253995 A | 10/2009 |

(Continued)

*Primary Examiner* — Douglas X Rodriguez
(74) *Attorney, Agent, or Firm* — Mintz Levin Cohn Ferris Glovsky and Popeo, P.C.; Peter F. Corless

(57) ABSTRACT

An apparatus and a method of determining a frequency of an AC power source that more accurately determine the frequency of the AC power source connected to a vehicle are provided. The apparatus includes a rectifier that is connected to the AC power source to rectify an AC voltage input from the AC power source, a first filter connected to an output terminal of the rectifier to filter a rectified voltage output by the rectifier and a second filter connected to the output terminal of the rectifier to filter the rectified voltage output by the rectifier. Further, a frequency determination unit configured to receive the rectified voltages that pass through the first and second filters and determine a voltage frequency of the AC power source from the rectified voltage that pass through the first filter using the rectified voltage that pass through the second filter as a frequency determination level.

12 Claims, 7 Drawing Sheets

(52) U.S. Cl.
CPC .............. *Y02T 90/14* (2013.01); *Y02T 90/163* (2013.01); *Y02T 90/169* (2013.01); *Y04S 30/14* (2013.01)

(56) References Cited

FOREIGN PATENT DOCUMENTS

| KR | 10-0182625 | 12/1998 |
| KR | 2013-0073236 A | 7/2013 |
| KR | 10-2015-0108133 A | 9/2015 |
| KR | 10-1567222 B1 | 11/2015 |

\* cited by examiner

APPARATUS AND METHOD OF DETERMINING FREQUENCY OF AC POWER SOURCE

CROSS-REFERENCE TO RELATED APPLICATION

This application claims under 35 U.S.C. § 119(a) the benefit of priority to Korean Patent Application No. 10-2016-0062602 filed on May 23, 2016, the entire contents of which are incorporated herein by reference.

BACKGROUND

(a) Field of the Invention

The present disclosure relates to an apparatus and method of determining a frequency of an AC power source, and more particularly, to an alternating current (AC) power source, which more accurately determines the frequency of the AC power source for charging a vehicle battery.

(b) Description of the Related Art

Typically, an eco-friendly vehicle such as an electric vehicle or a plug-in hybrid electric vehicle (HEV) uses an alternating current (AC) power source connected to a power distribution system to charge a vehicle battery. The eco-friendly vehicle includes an on-board charger (OBC) disposed therein for charging a vehicle battery, which receives power from an AC power source connected to the vehicle and charges the battery. An OBC disposed within a vehicle is configured to convert power of an external AC power source into direct current (DC) power and supply the converted DC power to a vehicle battery to charge the battery. In particular, the OBC includes a converter configured to convert an AC voltage into a DC voltage of a level required in the battery. Further, the OBC which charges the vehicle battery is configured to collect and monitor information regarding an AC power source prior to initiate battery charging when the OBC is connected to an external AC power source.

For example, when the OBC is unable to accurately determine information regarding the AC power source, particularly, information regarding a frequency of the AC power source, hardware may not be protected or hardware control may be difficult during battery charging and the hardware may be damaged. However, many problems are encountered while accommodating various characteristics of the power source since the voltage and frequency of the AC power source vary across countries or regions. Additionally, when noise enters power supplied by the AC power source or distortion or disturbance occurs in the power, the frequency of the power source is difficult to accurately determine.

The above information disclosed in this section is merely for enhancement of understanding of the background of the invention and therefore it may contain information that does not form the prior art that is already known in this country to a person of ordinary skill in the art.

SUMMARY

The present invention provides an apparatus and method of determining a frequency of an AC power source to more accurately determine the frequency of the AC power source connected to a vehicle, in consideration of the voltage range and frequency range of the AC power source used to charge a vehicle battery, which are determined based on the requirements of particular countries or regions.

In one aspect, the present invention provides a frequency determination apparatus for determining a frequency of an alternating current (AC) power source that may include a rectifier connected to the AC power source to rectify an AC voltage input from the AC power source, a first filter connected to an output terminal of the rectifier to filter a rectified voltage output by the rectifier, a second filter connected to the output terminal of the rectifier configured to filter the rectified voltage output by the rectifier and a frequency determination unit configured to receive the rectified voltages that passes through the first filter and the second filter and determine a voltage frequency of the AC power source from the rectified voltage that passes through the first filter based on the rectified voltage that passes through the second filter as a frequency determination level.

In another aspect, the present invention provides a method of determining a frequency of an alternating current (AC) power source that may include rectifying, by a rectifier, an AC voltage output by an AC power source, filtering, by a first filter connected to an output terminal of the rectifier a rectified voltage output by the rectifier, filtering, by a second filter connected to the output terminal of the rectifier the rectified voltage output by the rectifier, and determining a voltage frequency of the AC power source from the rectified voltage that passes through the first filter based on the rectified voltage that passes through the second filter as a frequency determination level.

BRIEF DESCRIPTION OF THE DRAWINGS

The above and other features of the present invention will now be described in detail with reference to exemplary embodiments thereof illustrated in the accompanying drawings which are given hereinbelow by way of illustration only, and thus are not limitative of the present invention, and wherein.

Figure 1:
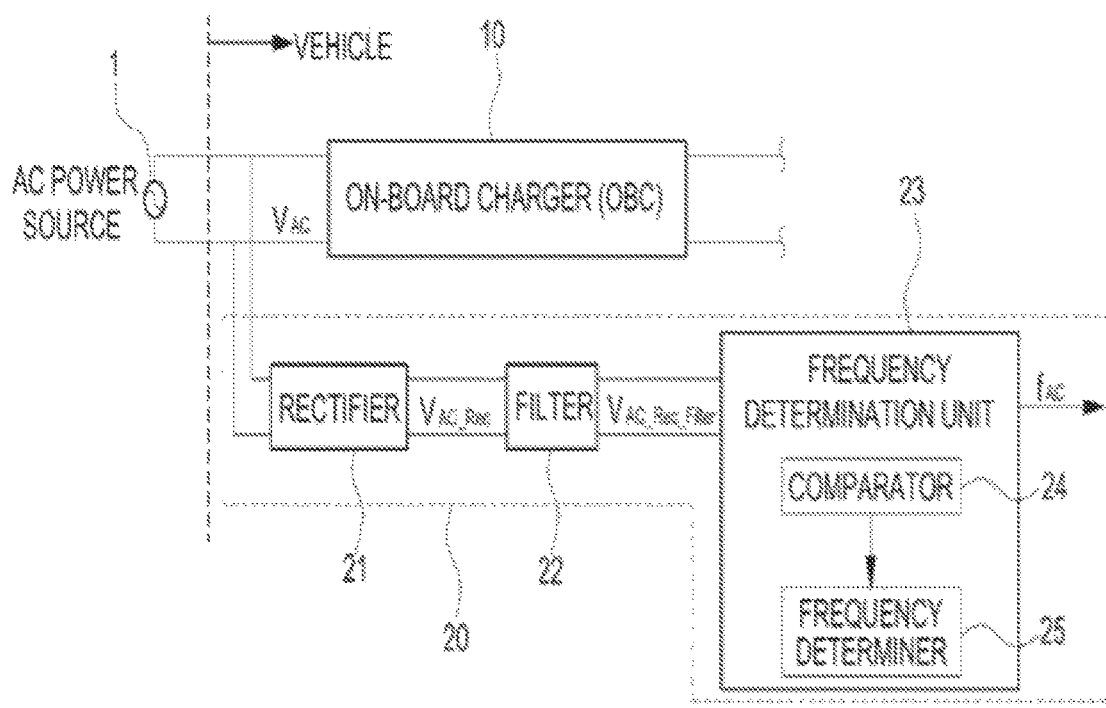
FIG. 1 is an exemplary block diagram of a conventional frequency determination apparatus according to the related art.

It should be understood that the appended drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

Hereinafter reference will be made in detail to various exemplary embodiments of the present invention, examples of which are illustrated in the accompanying drawings and described below. While the invention will be described in conjunction with exemplary embodiments, it will be understood that the present description is not intended to limit the invention to the exemplary embodiments. On the contrary, the invention is intended to cover not only the exemplary embodiments, but also various alternatives, modifications, equivalents and other exemplary embodiments within the spirit and scope of the invention as defined by the appended claims.

When a part "includes" an element, this means that the part may further include another element rather than excluding other elements, unless clearly stated otherwise. Prior to a description of an embodiment of the present invention, an apparatus and method of determining a frequency of an AC power source according to the prior art will be described first to aid in comparison with the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

FIG. 1 is an exemplary block diagram of a conventional frequency determination apparatus for determining a frequency of an AC power source. When a vehicle is connected to an external AC power source 1 for battery charging as illustrated in FIG. 1, a device for charging a battery in the vehicle, for example, an OBC 10 disposed within the vehicle may be electrically connected to the AC power source 1. Accordingly, an AC power output by the external AC power source 1 may be supplied to the OBC 10. In particular, when the AC power source 1 supplies an AC power of a voltage $V_{AC}$, an input AC voltage of the OBC 10 becomes $V_{AC}$ and the OBC 10 is configured to convert the input AC voltage $V_{AC}$ into a DC voltage required to charge the battery (e.g., a charging voltage $V_{DC}$ required by the battery) and outputs the charging voltage $V_{DC}$ to the battery. A conventional frequency determination apparatus 20 is connected to a connection circuit constructed between the AC power source 1 disposed at the exterior of the vehicle and the OBC 10 indisposed within the vehicle and may be configured to receive the AC voltage $V_{AC}$ supplied to the vehicle by the AC power source 1 via the connection circuit.

Figure 2:
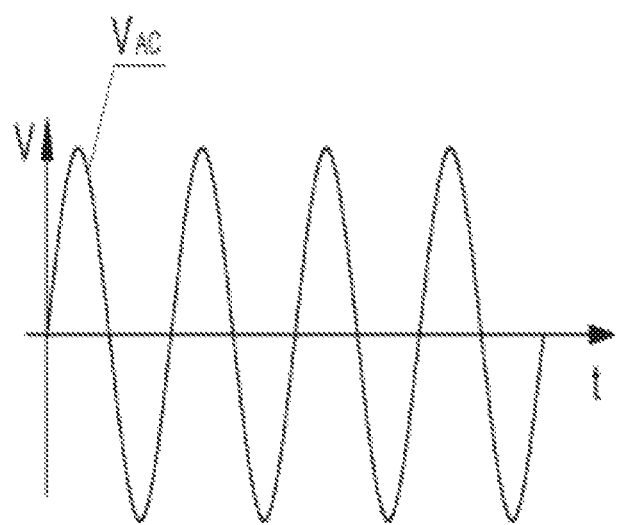
FIG. 2 is an exemplary diagram illustrating a waveform of a voltage of an AC power source input to the conventional frequency determination apparatus according to the related art.

FIG. 2 illustrates an exemplary waveform of the AC voltage input to the frequency determination apparatus by the AC power source, (e.g., a waveform of the input AC voltage $V_{AC}$). The conventional frequency determination apparatus 20 includes a rectifier 21, a filter 22, and a frequency determination unit 23. The rectifier 21 is configured to receive the AC voltage $V_{AC}$ from the AC power source 1, rectify the AC voltage $V_{AC}$ and outputs a rectified voltage $V_{AC\_Rec}$. The filter 22 is configured to filter the rectified voltage $V_{AC\_Rec}$ and outputs a filtered voltage $V_{Ac\_Rec\_Filter}$ to the frequency determination unit 23.

Figure 3:
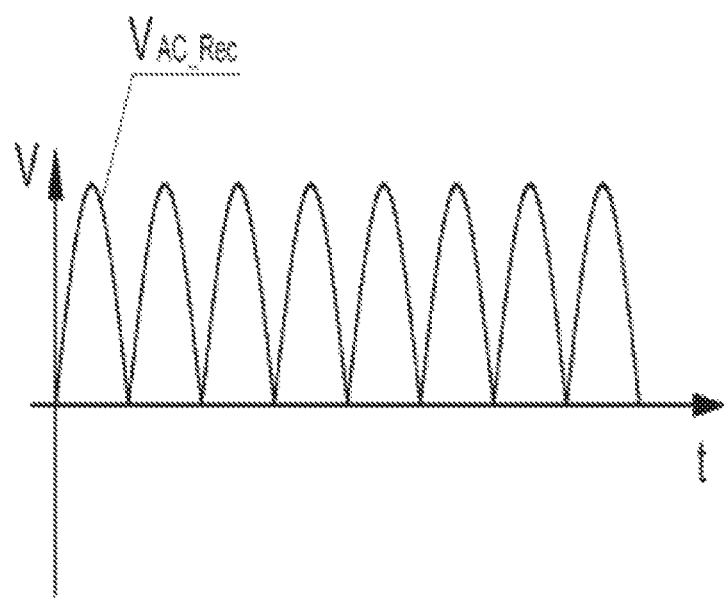
FIG. 3 is an exemplary diagram illustrating a waveform of a voltage rectified by a rectifier and then output in the conventional frequency determination apparatus according to the related art.

FIG. 3 illustrates an exemplary waveform of the voltage $V_{AC\_Rec}$ rectified by the rectifier 21. For example, when noise, disturbance, or distortion occurs in the AC power supplied by the AC power source 1, a frequency cannot be accurately determined and, therefore, the frequency determination apparatus 20 may further include the filter 22 to reduce noise. The filter 22 is an optional element. In a general frequency determination apparatus, a low pass filter (LPF) may be used as the filter 22. The frequency determination unit 23 includes a comparator 24 configured to compare the voltage $V_{AC\_Rec\_Filter}$ that passes through the filter 22 with a fixedly set frequency determination level and outputs a high (Hi) or low (Lo) pulse signal and a frequency determiner 25 configured to determine a frequency $f_{AC}$ of the AC power source from the pulse signal output by the comparator 24.

Figure 4:
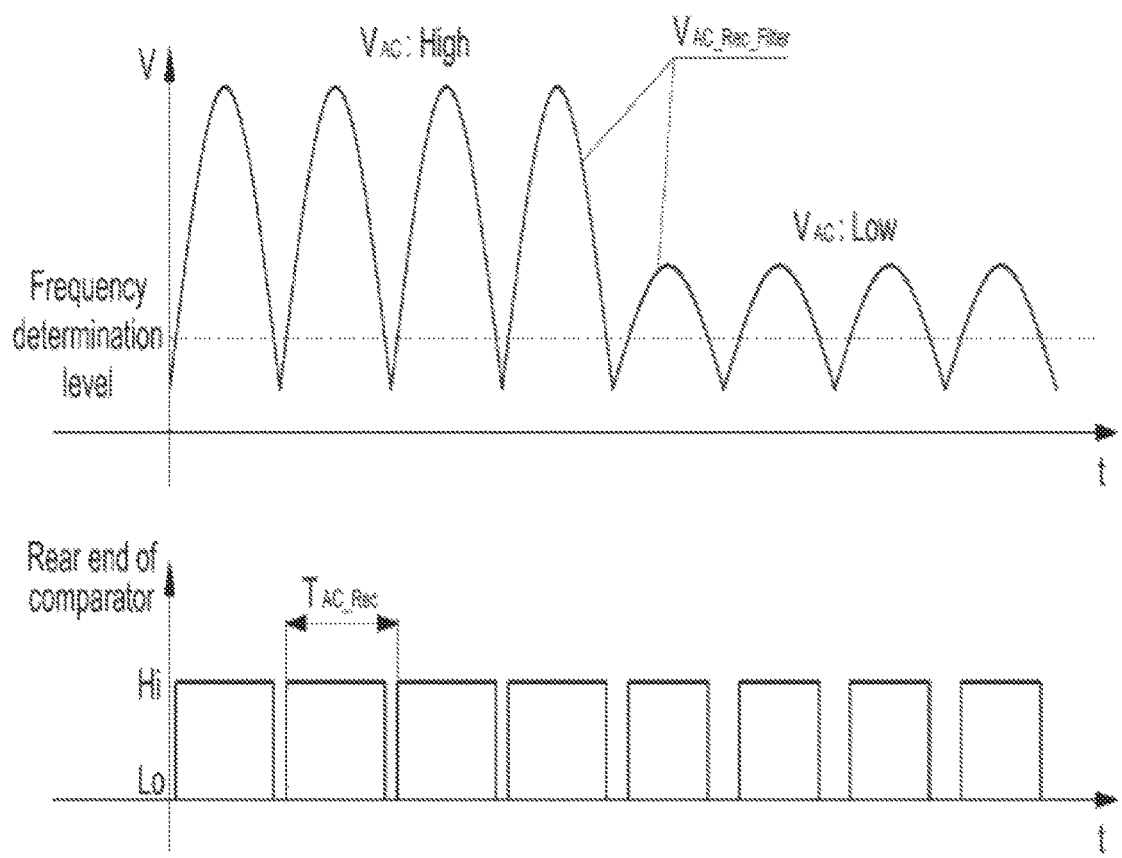
FIG. 4 is an exemplary diagram illustrating a waveform of a voltage passing through a filter in the conventional frequency determination apparatus and a conventional fixed frequency determination level according to the related art.

FIG. 4 is an exemplary diagram illustrating a waveform of the voltage $V_{AC\_Rec\_Filter}$ that passes through the filter 22 and a conventional fixed frequency determination level. Specifically, FIG. 4 illustrates a waveform of the filtered voltage $V_{AC\_Rec\_Filter}$ when the AC voltage $V_{AC}$ input by the AC power source 1 is at a substantially high level and when the AC voltage $V_{AC}$ input by the AC power source 1 is a relatively low level. The frequency determination level is a preset voltage value used by the comparator 24 to determine a frequency. Conventionally, a specific fixed voltage value has been used as the frequency determination level.

As illustrated, the comparator 24 is configured to compare the rectified voltage $V_{AC\_Rec\_Filter}$ that passes through the filter 22 with the fixedly set frequency determination level. For example, when the rectified voltage $V_{Ac\_Rec\_Filter}$ that passes through the filter 22 is equal to or greater than the frequency determination level, the comparator 24 is configured to generate a Hi signal. When the rectified voltage $V_{Ac\_Rec\_filter}$ that passes through the filter 22 is less than the frequency determination level, the comparator 24 is configured to generate a Lo signal. Accordingly, the comparator 24 of the frequency determination unit 23 is configured to generate a square wave signal, (e.g., a pulse signal), as illustrated in the lower portion of FIG. 4 and is configured to output the pulse signal to the frequency determiner 25. The frequency determiner 25 is configured to measure a pulse period $T_{AC\_Rec}$ from the pulse signal output by the comparator 24 and calculate a frequency $f_{AC}$ of the AC power source.

In particular, the frequency determiner 25 is configured to measure an occurrence pulse period $T_{AC\_Rec}$ of a rising edge from the square wave signal, i.e., the pulse signal, output by the comparator 24. The pulse period $T_{AC\_Rec}$ corresponds to a time interval that indicates a detection of a previous rising edge to a time interval that indicates detection of a next rising edge. The pulse period $T_{AC\_Rec}$ is a period of the rectified voltage waveform and the frequency $f_{AC}$ of the AC power source may be calculated by calculating a reciprocal after doubling the pulse period $T_{AC\_Rec}$ as indicated in Equation 1.

$$f_{AC}=1/(2\times T_{AC\_Rec}) \qquad \text{Equation 1}$$

However, the above-described conventional frequency determination apparatus has several limitations. For example, when a LPF having a low filter band is used, selection of the frequency determination level may be difficult and requires a tradeoff between the filter band and the frequency determination level. In other words, when the AC voltage $V_{AC}$ of the AC power source is low, the fixedly set frequency determination level may be beyond the range of the rectified voltage $V_{AC\_Rec}$ or $V_{AC\_Rec\_Filter}$ or may be beyond a proper level. Accordingly, determination of a frequency may be difficult. In addition, when an LPF having a low cutoff frequency is used, noise, disturbance, and distortion generated in the input AC voltage of the AC power source may be favorably handled but determining the frequency based on preselect the voltage value of the frequency determination level may be difficult.

In the conventional frequency determination apparatus and method that utilizes the fixed frequency determination level, when a filter having a low cutoff frequency is used, there may be a restriction on the cutoff frequency based on distortion of a signal around a low voltage and there may be an increased probability of incorrectly determining a frequency. Therefore, a frequency determination apparatus and method capable of solving the above problems that more accurately determine a frequency with respect to various voltage and frequency ranges of an AC power source are disclosed.

According to the present invention, the frequency determination level for determining a frequency may not be fixed to a preset voltage value but may be adjusted based on to an AC voltage of an AC power source. More specifically, a voltage obtained by filtering, may include an additional filter, the frequency determination level maybe based on a waveform of a voltage rectified by the rectifier. In particular, the frequency determination level may be flexibly determined based on the AC voltage of the AC power source. In particular, a flexible frequency determination level based on the voltage of the AC power source may be used to determine a frequency.

Figure 5:
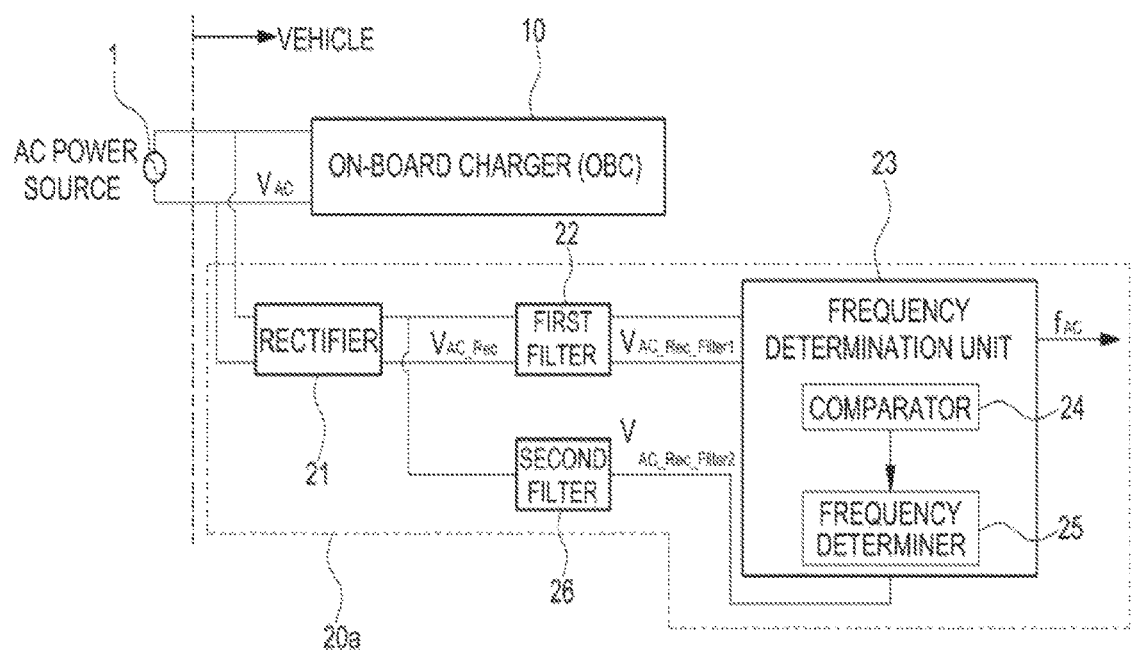
FIG. 5 is an exemplary block diagram of a frequency determination apparatus according to an exemplary embodiment of the present invention.

Reference is made to FIG. 5 that illustrates an exemplary block diagram of a frequency determination apparatus according to an exemplary embodiment of the present invention. A frequency determination apparatus 20a according to an exemplary embodiment of the present invention may be connected to a connection circuit disposed between an AC power source 1 positioned extraneous to a vehicle and an OBC 10 disposed within the vehicle and may be configured to receive via the connection circuit, an AC voltage $V_{AC}$ supplied to the vehicle by the AC power source 1. A waveform of the AC voltage $V_{AC}$ input to the frequency determination apparatus 20a by the AC power source 1 according to an exemplary embodiment of the present invention may be similar to the waveform of FIG. 2.

Additionally, as illustrated in FIG. 5, the frequency determination apparatus 20a according to an exemplary embodiment of the present invention may include a rectifier 21, a first filter 22, a second filter 26, and a frequency determination unit 23. The rectifier 21 may be configured to receive the AC voltage $V_{AC}$ from the AC power source 1, rectify the AC voltage $V_{AC}$, and output a rectified voltage $V_{AC\_Rec}$. The first filer 22 connected to an output terminal of the rectifier 21 may be configured to filter the rectified voltage $V_{AC\_Rec}$ and output a filtered voltage $V_{AC\_Rec\_Filter1}$ to the frequency determination unit 23. A waveform of the voltage $V_{AC\_Rec}$ rectified by the rectifier 21 may not different from the waveform of FIG. 3. The first filter 22 corresponds to the filter used in the conventional frequency determination apparatus and may use an LPF. The second filter 26 may be connected to the output terminal of the rectifier 21 like the first filter 22 and may be configured to receive the voltage $V_{AC\_Rec}$ rectified by the rectifier 21 similar to the first filter 22.

In the frequency determination apparatus 20a according to an exemplary embodiment of the present invention, the second filter 26 may include an LPF similar to the first filter 22. For example, a filter having a relatively high cutoff frequency may be used as the first filter 22 and a filter having a lower cutoff frequency than the first filter 22 may be used as the second filter 26. The second filter 26 may be configured to filter the voltage $V_{AC\_Rec}$ rectified by the rectifier 21 and outputs a filtered voltage $V_{AC\_Rec\_Filter2}$ to the frequency determination unit 23. The voltage $V_{AC\_Rec\_Filter2}$ output after being filtered by the second filter 26 may be used as a frequency determination level by the frequency determination unit 23. In other words, the voltage $V_{AC\_Rec\_Filter2}$ that passes through the second filter 26 may become the frequency determination level value for frequency determination.

Figure 6:
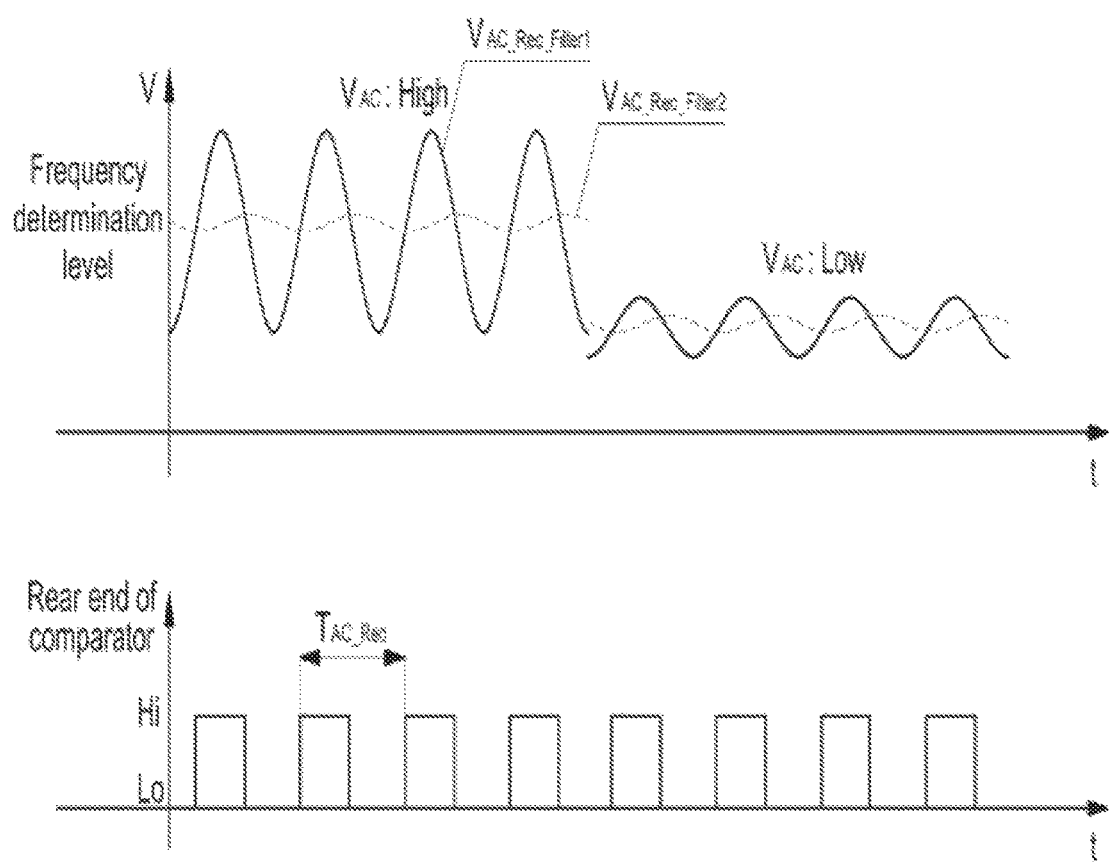
FIG. 6 is an exemplary diagram illustrating waveforms of voltages passing through filters in the frequency determination apparatus and a flexible frequency determination level according to an AC power source, according to an exemplary embodiment of the present invention.

The voltage $V_{AC\_Rec\_Filter2}$ that passes through the second filter 26 become an approximate middle value between a maximum value and a minimum value in a waveform of the voltage $V_{AC\_Rec}$ obtained by rectifying the AC voltage $V_{AC}$ of the AC power source and a waveform of the rectified voltage $V_{AC\_Rec\_Filter1}$ that passes through the first filter 22, (e.g., a value approximating the center of the waveform). In particular, the voltage value $V_{AC\_Rec\_Filter2}$ (used as the frequency determination level value) passes through the second filter 26 may be disposed at the center of a rectified waveform of the AC voltage and the center of the waveform of the voltage $V_{AC\_Rec\_Filter2}$ that passes through the first filter 22 as illustrated in FIG. 6. In the above configuration, the frequency determination unit 23 may include a comparator 24 configured to compare the voltage $V_{AC\_Rec\_Filter1}$ that passes through the first filter 22 with the voltage $V_{AC\_Rec\_Filter2}$ that passes through the second filter 26. Further, a Hi or Lo pulse signal and a frequency determiner 25 may be output and maybe configured to determine a frequency $f_{AC}$ of the AC power source 1 from the pulse signal output by the comparator 24.

Figure 7:
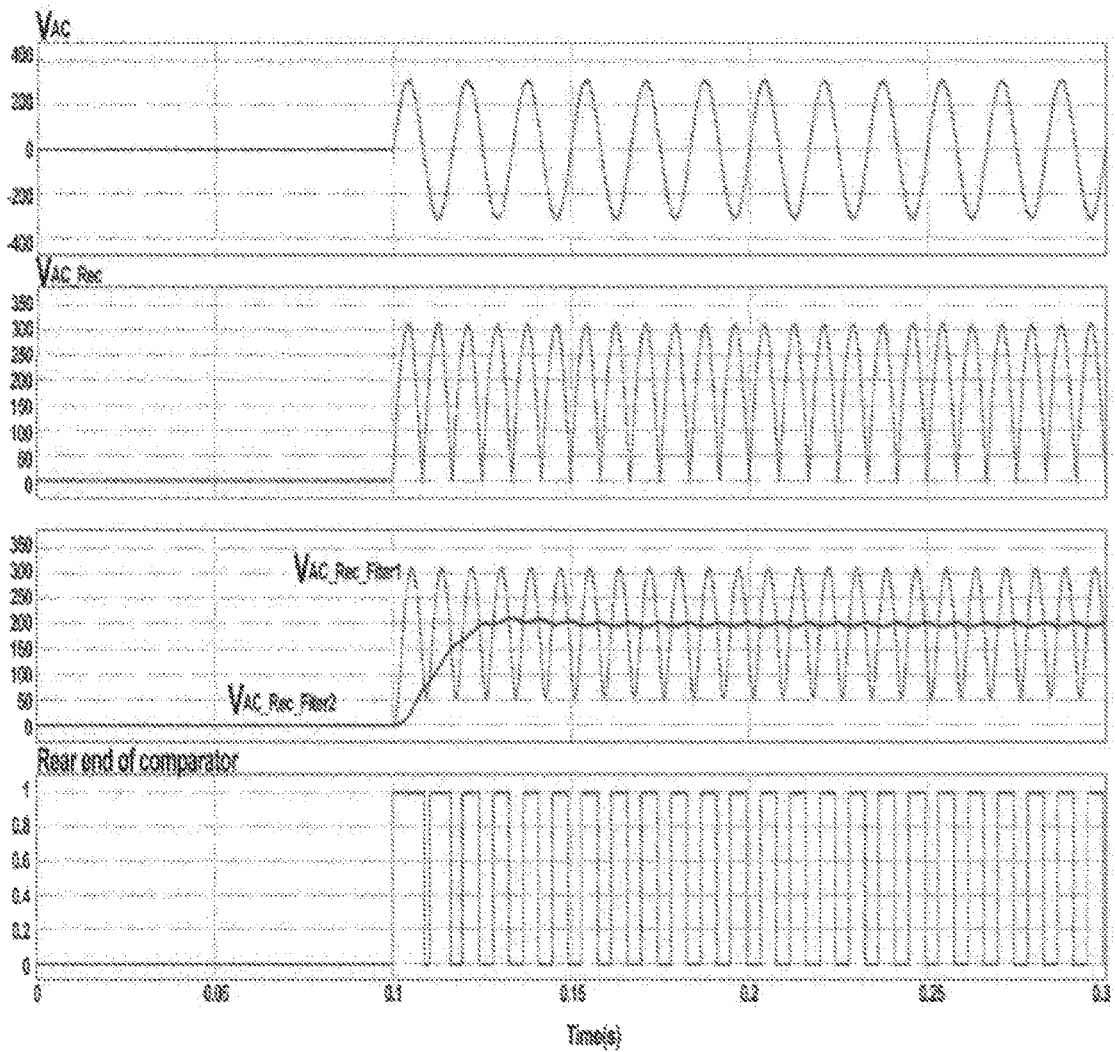
FIG. 7 is an exemplary diagram illustrating reference values according to an exemplary embodiment of the present invention.

FIG. 6 illustrates an exemplary waveform of the voltage $V_{AC\_Rec\_Filter1}$ that passes through the first filter 22 and a waveform of the voltage $V_{AC\_Rec\_Filter2}$ that may be used as the frequency determination level after passing through the second filter 26 and illustrates waveforms of rectified voltages when the AC voltage $V_{AC}$ input by the AC power source 1 may be relatively high and when the input AC voltage $V_{AC}$ may be relatively low. The comparator 24 may be configured to compare the voltage $V_{AC\_Rec\_Filter1}$ that passes through the first filter 22 with the voltage $V_{AC\_Rec\_Filter2}$ (corresponding to the frequency determination level in the present invention) that passes through the second filter 26. When the voltage $V_{AC\_Rec\_Filter1}$ that passes through the first filter 22 is equal to or greater than the voltage $V_{AC\_Rec\_Filter2}$, which is the frequency determination level that passes through the second filter 26, the comparator 24 may be configured to generate a Hi signal. Further, when the voltage $V_{AC\_Rec\_filter1}$ that passes through the first filter 22 is less than the voltage $V_{AC\_Rec\_Filter2}$ that passes through the second filter 26, the comparator 24 may be configured to generate a Lo signal as shown in FIG. 7.

Consequently, the comparator 24 of the frequency determination unit 23 may be configured to generate a square wave signal, (e.g., a pulse signal) as illustrated in FIG. 6 and the pulse signal may be input to the frequency determiner 25. The frequency determiner 25 may be configured to measure a pulse period $T_{AC\_Rec}$ from the pulse signal input by the comparator 24 and calculate a voltage frequency $f_{AC}$ of the AC power source 1. In particular, the frequency determiner 25 may be configured to measure an occurrence of the pulse period $T_{AC\_Rec}$ of a rising edge from the square wave signal (e.g., the pulse signal) that may be output by the comparator 24. The pulse period $T_{AC\_Rec}$ may correspond to a time from a time interval at which a first rising edge is detected to a interval at which a next rising edge is detected. The pulse period $T_{AC\_Rec}$ may be a period of the rectified voltage waveform. The voltage frequency $f_{AC}$ of the AC power source 1 may be calculated by the controller by taking a reciprocal after doubling the pulse period $T_{AC\_Rec}$ as indicated in Equation 1.

A method may include the frequency determiner 25 that may be configured to determine the voltage frequency $f_{AC}$ of the AC power source 1 from the pulse signal generated by the comparator 24. In the frequency determination apparatus and method according to the present invention, when a frequency determination level is flexibly determined based on a voltage of an AC power source, frequency determination may be performed with respect to all various voltage ranges.

Additionally, cutoff frequencies of the first and second filters may be freely selected based on a frequency use range of an AC power source. For example, selection of a band of the first filter may not be restricted since the frequency determination level may be disposed at the center of a rectified voltage waveform of the AC power source. Since a voltage of the AC power source may be filtered using two filters including the first filter, a more accurate frequency determination may be made even when noise enters power of the AC power source or disturbance or distortion occurs in the power of the AC power source. Further, hardware damage caused by incorrect frequency determination may be prevented and may terminate operation of the OBC due to lack of control during the incorrect frequency determination maybe prevented. Furthermore, since a charging power of an OBC may be limited based on a frequency range, restriction of the charging power caused by incorrect determination of the AC power source may be minimized and charging time may be reduced.

The invention has been described in detail with reference to exemplary embodiments thereof. However, it will be appreciated by those skilled in the art that changes may be made in these exemplary embodiments without departing from the principles and spirit of the invention, the scope of which is defined in the appended claims and their equivalents.

What is claimed is:

1. A frequency determination apparatus for determining a voltage frequency of an alternating current (AC) power source, comprising:
   a rectifier connected to the AC power source and configured to rectify an AC voltage input from the AC power source;
   a first filter connected to an output terminal of the rectifier and configured to filter a rectified voltage output by the rectifier;
   a second filter connected to the output terminal of the rectifier and configured to filter the rectified voltage output by the rectifier; and
   a frequency determination unit configured to receive the rectified voltages that pass through the first filter and the second filter and determine the voltage frequency of the AC power source based on the rectified voltage that passes through the first filter using the rectified voltage that passes through the second filter as a frequency determination level,
   wherein the frequency determination unit includes:
      a comparator configured to compare the rectified voltage that passes through the first filter with the frequency determination level that corresponds to the rectified voltage that passes through the second filter and generate a high or low pulse signal; and
      a frequency determiner configured to determine the voltage frequency of the AC power source based on the generated high or low pulse signal.

2. The frequency determination apparatus of claim 1, wherein the first filter and the second filter are low pass filters (LPF) having different cutoff frequencies.

3. The frequency determination apparatus of claim 2, wherein the second filter has a lower cutoff frequency than the first filter.

4. The frequency determination apparatus of claim 1, wherein the comparator is configured to generate the high pulse signal when the rectified voltage that passes through the first filter is equal to or greater than the rectified voltage that passes through the second filter and generate the low pulse signal when the rectified voltage that passes through the first filter is less than the rectified voltage that passes through the second filter.

5. The frequency determination apparatus of claim 1, wherein the first filter and the second filter are low pass filters having different cutoff frequencies and the second filter has a lower cutoff frequency than the first filter.

6. The frequency determination apparatus of claim 1, wherein the frequency determiner is configured to measure a pulse period of the high or low pulse signal output by the comparator and determine a value based on a reciprocal after doubling the measured pulse period $T_{AC\_Rec}$) as the voltage frequency ($f_{AC}$, where $f_{AC}=1/(2 \times T_{AC\_Rec})$) of the AC power source.

7. The frequency determination apparatus of claim 1, wherein the AC power source is a battery charging AC power source disposed extraneous to a vehicle and electrically connected to an on-board charger disposed within the vehicle when the AC power source is connected to the vehicle and an input terminal of the rectifier is electrically connected to a connection circuit disposed between the AC power source and the on-board charger of the vehicle to provide the AC voltage of the AC power source to the rectifier for battery charging when the vehicle is coupled to the AC power source.

8. A method of determining a voltage frequency of an alternating current (AC) power source, comprising:
   rectifying, by a rectifier, an AC voltage output by the AC power source;
   filtering, by a first filter connected to an output terminal of the rectifier, a rectified voltage output by the rectifier;
   filtering, by a second filter connected to the output terminal of the rectifier, the rectified voltage output by the rectifier;
   determining, by a controller, the voltage frequency of the AC power source based on the rectified voltage that passes through the first filter using the rectified voltage that passes through the second filter as a frequency determination level;
   comparing, by a comparator, the rectified voltage that passes through the first filter with the frequency determination level that corresponds to the rectified voltage that passes through the second filter and generating a high or low pulse signal;
   determining by the controller, the voltage frequency of the AC power source from the high or low pulse signal generated by the comparator; and
   generating, by the controller, the high pulse signal when the rectified voltage that passes through the first filter is equal to or greater than the rectified voltage that passes through the second filter and generating the low pulse signal when the rectified voltage that passes through the first filter is less than the rectified voltage that passes through the second filter.

9. The method of claim 8, wherein the first filter and the second filter are low pass filters having different cutoff frequencies.

10. The method of claim 9, wherein the second filter has a cutoff frequency less than the first filter.

11. The method of claim 8, wherein the voltage frequency of the AC power source is determined as a value obtained by measuring a pulse period of the high or low pulse signal output by the comparator and calculating a reciprocal after doubling the measured pulse period.

12. The method of claim 8, wherein the AC power source is a battery charging AC power source positioned extraneous to a vehicle and electrically coupled to an on-board charger disposed in the vehicle when the AC power source is connected to the vehicle and an input terminal of the rectifier is electrically connected to a connection circuit disposed between the AC power source and the on-board charger of the vehicle and receiving by the rectifier the AC voltage of the AC power source, when the vehicle is connected to the AC power source for battery charging.

* * * * *